US008971143B2

(12) United States Patent
Kodama et al.

(10) Patent No.: US 8,971,143 B2
(45) Date of Patent: Mar. 3, 2015

(54) SEMICONDUCTOR DEVICE PERIODICALLY UPDATING DELAY LOCKED LOOP CIRCUIT (75) Inventors: Takuyo Kodama, Tokyo (JP); Kosuke Goto, Tokyo (JP)

(73) Assignee: PS4 Luxco S.a.r.l, Luxembourg (LU)

( * ) Notice: Subject to any disclaimer, the term of this patent is extended or adjusted under 35 U.S.C. 154(b) by 230 days.

(21) Appl. No.: 13/315,128

(22) Filed: Dec. 8, 2011

(65) Prior Publication Data
US 2012/0155206 A1  Jun. 21, 2012

(30) Foreign Application Priority Data

Dec. 16, 2010  (JP) .................................. 2010-280423

(51) Int. Cl.
*G11C 11/402* (2006.01)
*G11C 8/18* (2006.01)
*H03L 7/00* (2006.01)
*G11C 7/10* (2006.01)
*G11C 7/22* (2006.01)
*G11C 11/406* (2006.01)

(52) U.S. Cl.
CPC .............. *G11C 7/1072* (2013.01); *G11C 7/222* (2013.01); *G11C 11/40615* (2013.01)
USPC ....... 365/222; 365/233.11; 327/141; 327/144

(58) Field of Classification Search
None
See application file for complete search history.

(56) References Cited

U.S. PATENT DOCUMENTS

| 5,751,655 | A | * | 5/1998 | Yamazaki et al. | ........ 365/233.14 |
| 5,812,490 | A | * | 9/1998 | Tsukude | .................. 365/233.11 |
| 6,026,498 | A | | 2/2000 | Fuse et al. | |
| 2004/0174760 | A1 | | 9/2004 | Lim et al. | |

FOREIGN PATENT DOCUMENTS

| JP | H 08-54955 A | 2/1996 |
| JP | H 08-272479 A | 10/1996 |
| JP | 2004-273106 A | 9/2004 |
| JP | 2005-071203 A | 3/2005 |

* cited by examiner

*Primary Examiner* — Hoai V Ho
*Assistant Examiner* — James G Norman
(74) *Attorney, Agent, or Firm* — McGinn IP Law Group, PLLC (57) ABSTRACT Such a device is disclosed that includes a control circuit outputting a first clock signal having a first clock cycle in response to a first command signal and outputting a second clock signal having a second clock cycle in response to a second command signal, a first circuit controlled based on the first clock signal, and a second circuit controlled based on the second clock signal.

11 Claims, 6 Drawing Sheets

FIG.6

# SEMICONDUCTOR DEVICE PERIODICALLY UPDATING DELAY LOCKED LOOP CIRCUIT

BACKGROUND OF THE INVENTION

1. Field of the Invention

The present invention relates to a semiconductor device, and more particularly relates to a semiconductor device that periodically updates a DLL (Delay Locked Loop) circuit.

2. Description of Related Art

Because the present invention relates to a DLL circuit and a refresh circuit, a refresh operation and a DLL operation are briefly explained first as the background techniques of this invention to facilitate understanding thereof. The refresh operation is periodically performed to hold data stored in memory cells in a DRAM (Dynamic Random Access Memory). The refresh operation includes an auto-refresh operation performed by external instructions and a self-refresh operation autonomously performed particularly when an operation of a semiconductor device is stopped (in a power down state). The time interval of the self-refresh operation is specified by a periodic signal generated by an oscillator in the semiconductor device. While the periodic signal generated by the oscillator has a flexibility depending on its design, its time interval can be, for example, 7.6 µs according to the interval of the auto-refresh operation.

The DLL operation is for adjusting the phase of internal clock signals so that the semiconductor device can output read data in synchronization with external clocks. It is known that the DLL operation has relatively large power consumption and is not always performed during an operation of the semiconductor device, but is performed at a certain time after the refresh operation ends, as disclosed in Japanese Patent Application Laid-open No. 2004-273106, for example. Hereinafter, such a periodic activation of the DLL circuit is called "periodic update of the DLL circuit".

Japanese Patent Application Laid-open No. 2004-273106 discloses a technique related to a refresh operation of a semiconductor device including a DLL circuit.

Such a circuit is desired that controls a DLL operation and a refresh operation that are periodically performed, respectively, without having any problems and at a reduced area.

SUMMARY

In one embodiment, there is provided a semiconductor device that includes: a control circuit outputting a first clock signal having a first clock cycle in response to a first command signal and outputting a second clock signal having a second clock cycle in response to a second command signal; a first circuit controlled based on the first clock signal; and a second circuit controlled based on the second clock signal.

In another embodiment, there is provided a semiconductor device that includes: a control circuit generating a first signal periodically activated in a first cycle and a second signal periodically activated in a second cycle different from the first cycle; a first circuit activated based on the first signal; and a second circuit activated based on the second signal. The first and second circuits are exclusively activated.

In another embodiment, there is provided a semiconductor device that includes: a clock generation circuit generating a clock signal in response to each of first and second commands; a first circuit outputting a first signal in response to the clock signal when receives the first command; and a second circuit outputting a second signal in response to the clock signal when receives the second command. The first signal is used only inside of the semiconductor device and the second signal being outputted from the inside to an outside of the semiconductor device.

DETAILED DESCRIPTION OF THE EMBODIMENTS

To facilitate understanding of characteristic features of an embodiment of the present invention, the technical concept of the embodiment of the present invention examined by the present inventors is explained first.

Considering a fact that both a self-refresh operation and a DLL operation require periodic updates, it suffices that, also in the DLL operation, an oscillator circuit such as that used for the refresh operation is provided and then control is performed so that the DLL operation is performed using its output clocks. However, providing two oscillator circuits that require a certain area is not preferable because it causes an increase in size. Therefore, the present inventors have examined a mutual relationship between the self-refresh operation and the DLL operation.

Because the self-refresh operation is for holding data of memory cells in the power down state as described in the background technique, it is needless to mention that any data is not read, that is, any DLL operation is not required during the self-refresh operation. Meanwhile, because the DLL operation is required when a semiconductor device performs reading or the like, the self-refresh operation is not required during the DLL operation. That is, the operation period of the DLL operation does not need to overlap that of the self-refresh operation. Accordingly, a shared oscillator circuit that is operated for the DLL operation in one period and for the self-refresh operation in the other period can be provided.

The period of the self-refresh operation is determined by the relationship between the period that memory cells hold data and consumption power. That is, when the period is extended, the consumption power can be suppressed, but a margin that memory cells hold data is reduced. In contrast, when the period is shortened, the margin can be ensured but the consumption power is increased. Meanwhile, the period of the DLL operation does not at all relate to the period of the self-refresh operation and is determined by a requirement of the DLL operation itself. Even when the oscillator circuit is shared, it is desirable that periods according to the respective operations can be generated.

The embodiment of present invention provides a semiconductor device that includes a shared oscillator circuit that can generate periods suitable for a self-refresh operation and a DLL operation.

Preferred embodiments of the present invention will be explained below in detail with reference to the accompanying drawings.

Figure 1:
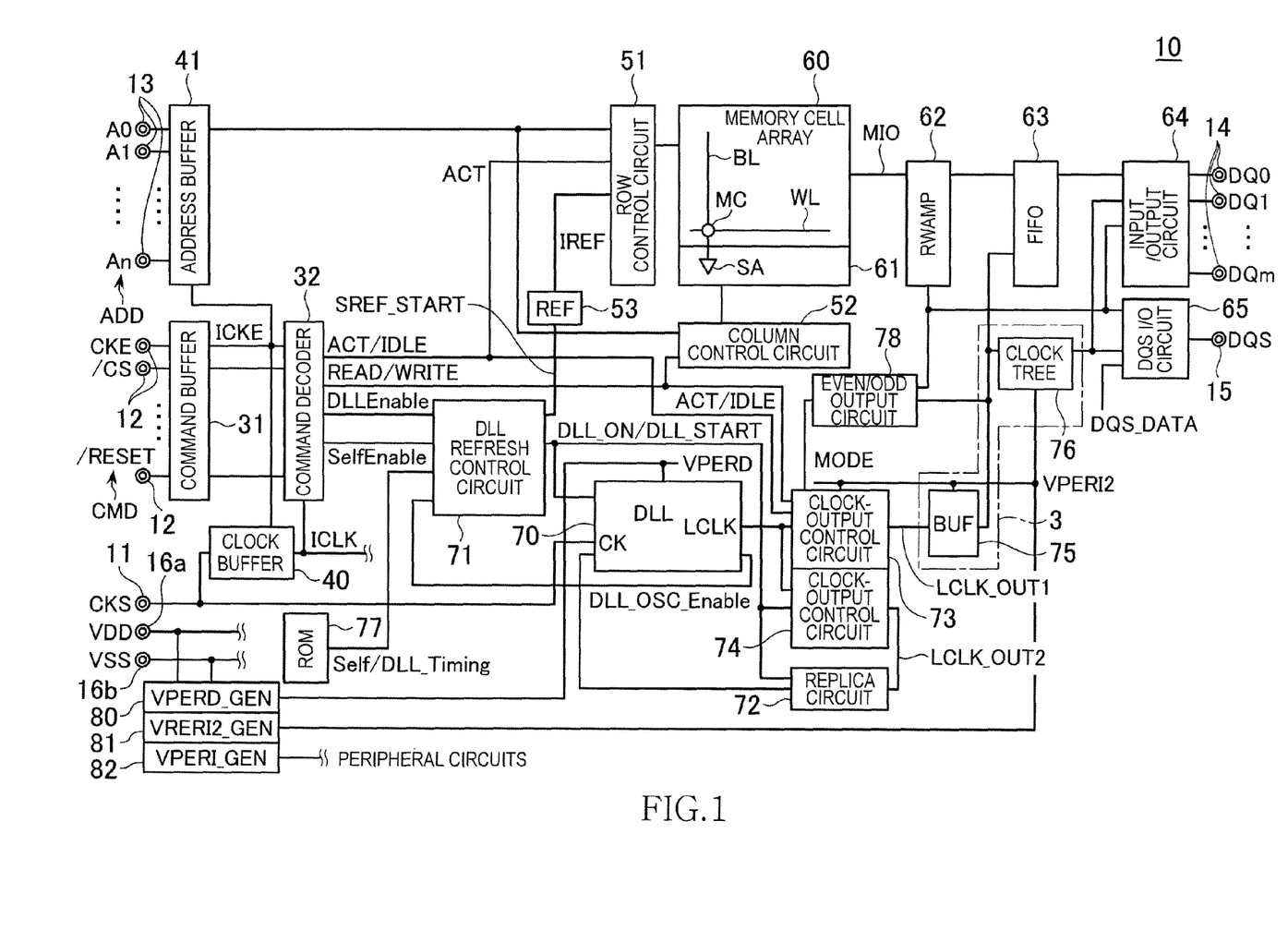
FIG. 1 is a block diagram indicative of an embodiment of an overall configuration of a semiconductor device 10.

Referring now to FIG. 1, the semiconductor device 10 according to a first embodiment of the present invention is a DDR SDRAM (Synchronous Dynamic Random Access Memory), and includes a clock terminal 11, a command terminal 12, an address terminal 13, a data input/output terminal 14, a data strobe terminal 15, and power-supply terminals 16a and 16b, as external terminals.

The clock terminal 11 is a terminal to which an external clock signal CKS is supplied. The supplied external clock signal CKS is then supplied to a clock buffer 40 and a DLL circuit 70 (second circuit). The clock buffer 40 generates a single-phase internal clock signal ICLK based on the external clock signal CKS, and supplies the generated internal clock signal to a command decoder 32 and other circuits that are not shown in the drawings.

The DLL circuit 70 is a circuit that receives the external clock signal CKS and generates an internal clock signal LCLK subjected to phase control with respect to the external clock signal CKS and also duty control. The generated internal clock signal LCLK is supplied to clock-output control circuits 73 and 74.

The DLL circuit 70 has a function of determining whether each of a phase and a duty ratio of the internal clock signal LCLK reaches a target value (whether it is locked) and a function of activating, when it is determined that the phase and the duty ratio are locked, an oscillator enable signal DLL_OSC_Enable. The oscillator enable signal DLL_OSC_Enable is supplied to a DLL refresh control circuit 71 (control circuit).

The clock-output control circuit 73 is a circuit that receives the internal clock signal LCLK and generates an internal clock signal LCLK_OUT1 while switching an operation mode according to the activation state of an internal active command ACT and of an internal read command READ (both are described later). When both the internal active command ACT and the internal read command READ are activated, the clock-output control circuit 73 outputs the internal clock signal LCLK as the internal clock signal LCLK_OUT1. In other cases, the clock-output control circuit 73 fixes an output potential to a low level or a high level.

The internal clock signal LCLK_OUT1 generated by the clock-output control circuit 73 passes through a buffer circuit 75 and is supplied to a clock tree 76 and a FIFO 63. The buffer circuit 75 is constituted by a plurality of serially connected CMOSs and has a function of shaping the waveform of the internal clock signal LCLK_OUT1. The clock tree 76 distributes the supplied internal clock signal LCLK_OUT1 to an input/output circuit 64 and a DQS input/output circuit 65. The clock tree 76 is also constituted so as to internally include a plurality of CMOSs. The buffer circuit 75 and the clock tree 76 constitute a clock transmission circuit 3 that transmits the internal clock signal LCLK_OUT1.

The clock-output control circuit 74 is a circuit that, when either one of a DLL ON signal DLL_ON or a DLL start signal DLL_Start (both are described later) is activated, supplies the internal clock signal LCLK to a replica circuit 72 as an internal clock signal LCLK_OUT2. In other cases, an output of the clock-output control circuit 74 is fixed to a low level or a high level.

The replica circuit 72 is a circuit that performs pseudo-replication of the clock transmission circuit 3. The internal clock signal LCLK_OUT2 input to the replica circuit 72 is supplied to the DLL circuit 70 while receiving a delay and a waveform change that are substantially the same as those received by the internal clock signal LCLK_OUT1 while passing through the clock transmission circuit 3.

The command terminal 12 is a terminal to which various command signals CMD, such as a clock enable signal CKE, a row-address strobe signal /RAS, a column-address strobe signal /CAS, a write enable signal /WE, a chip select signal /CS, an on-die termination signal ODT, a reset signal /RESET, an auto-refresh command signal CBRREF, a self-refresh start command SELF, and a DLL periodic-update start-command signal DLL are supplied. The signals having signal names that begin with "/" in the present specification mean inverted signals of their corresponding signals or active low signals.

The command signals CMD supplied to the command terminal 12 are supplied to a command buffer 31. These command signals CMD supplied to the command buffer 31 are shaped and supplied to the command decoder 32. The clock enable signal CKE is also supplied to the clock buffer 40 and an address buffer 41 as an internal clock enable signal ICKE. The clock buffer 40 and the address buffer 41 are operated only when the internal clock enable signal ICKE is activated.

The command decoder 32 is a circuit that generates various internal commands by holding, decoding, and counting the command signals CMD. These internal commands include a self-refresh command SelfEnable (first command signal) instructing start/stop of self refresh of a memory cell array 60 and a DLL enable command DLLEnable (second command signal) instructing activation/deactivation of the DLL circuit 70, as well as various internal commands related to read/write of a memory cell, such as the internal active command ACT, an internal idle command IDLE, the internal read command READ, and an internal write command WRITE. The self-refresh command SelfEnable is activated in response to an input of the self-refresh start command SELF, and the DLL enable command DLLEnable is activated in response to an input of the DLL periodic-update start-command signal DLL.

Each of the internal commands generated by the command decoder 32 is supplied to each circuit in the semiconductor device 10. Specifically, the internal active command ACT is supplied to a row control circuit 51, the internal active command ACT, the internal read command READ, and the internal idle command IDLE are supplied to the clock-output control circuit 73, the internal read command READ is supplied to a column control circuit 52, and the self-refresh command SelfEnable and the DLL enable command DLLEnable are supplied to the DLL refresh control circuit 71.

The address terminal 13 is a terminal to which an address signal ADD constituted by n+1 address bits A0 to An is supplied, and the supplied address signal ADD is supplied to the address buffer 41. The address signal ADD supplied to the address buffer 41 is latched, a row address is supplied to the row control circuit 51, and a column address is supplied to the column control circuit 52. Furthermore, when an entry is made to a mode register set, the address signal ADD is supplied to a mode register (not shown), by which contents of the mode register are updated.

The row control circuit 51 is a circuit that selects any one of word lines WL included in the memory cell array 60 based on the row address supplied from the address buffer 41. In the memory cell array 60, a plurality of word lines WL and a plurality of bit lines BL intersect with each other, and a memory cell MC is arranged at each of the intersections. (only one word line WL, one bit line BL, and one memory cell MC are shown in FIG. 1). Each of the bit lines BL is connected to a corresponding sense amplifier SA in a sense circuit 61.

The column control circuit 52 is a circuit that selects any one of sense amplifiers SA included in the sense circuit 61. The sense amplifier SA selected by the column control circuit 52 is connected to a read/write amplifier (RWAMP) 62 via a main I/O line MIO.

In a read operation, read data DQ amplified by the sense amplifier SA is further amplified by the read/write amplifier 62, and output to outside from the data input/output terminal 14 via the FIFO 63 and the input/output circuit 64. On the other hand, in a write operation, write data DQ input from outside via the data input/output terminal 14 is input to the read/write amplifier 62 via the FIFO 63 and the input/output circuit 64, and supplied to the sense amplifier SA after being amplified.

The data input/output terminal 14 is a terminal for performing an output of the read data DQ and an input of the write data DQ. In the semiconductor device 10, m+1 data input/output terminals 14 are provided, where m≥0, so that data of m+1 bits can be input or output simultaneously.

The FIFO 63 is a first-in first-out circuit that performs queuing of the read data DQ or the write data DQ, and is provided in each of the data input/output terminals 14. To explain the FIFO 63 with its read operation, the read data DQ output from the read/write amplifier 62 is distributed to each of the data input/output terminals 14 by a multiplexer (not shown) and queued in the corresponding FIFO 63. The FIFO 63 outputs the queued read data DQ to the input/output circuit 64 at a timing synchronized with the internal clock signal LCLK.

The input/output circuit 64 is configured to include an output circuit and an input circuit provided in each of the data input/output terminals 14. To explain the input/output circuit 64 with its read operation, the input/output circuit 64 shapes the read data DQ output from the corresponding FIFO 63, and outputs the shaped read data DQ to outside from the corresponding data input/output terminal 14 at a timing synchronized with the internal clock signal LCLK_OUT1.

The data strobe terminal 15 is a terminal for performing input/output of a data strobe signal DQS that serves as an operation reference of data input/output between the DQS input/output circuit 65 and an external controller. The DQS input/output circuit 65 is configured to include an output circuit and an input circuit provided in each of the data input/output terminals 14.

In the write operation, the data strobe signal DQS is input to the DQS input/output circuit 65 from outside via the data strobe terminal 15. The DQS input/output circuit 65 controls a timing at which the input/output circuit 64 loads the write data DQ from the data input/output terminal 14, based on the data strobe signal DQS that is input in the above manner.

On the other hand, in the read operation, a data-strobe data signal DQS_DATA is supplied from the inside of the semiconductor device 10 to the DQS input/output circuit 65. The DQS input/output circuit 65 outputs the data-strobe data signal DQS_DATA to the data strobe terminal 15 in synchronization with the internal clock signal LCLK_OUT1 supplied from the clock tree 76. The external controller loads the read data DQ output from the data input/output terminal 14 in synchronization with the data-strobe data signal DQS_DATA output in the above manner.

The DLL refresh control circuit 71 is a control circuit that controls a timing at which the memory cell array 60 performs self refresh and a timing at which the DLL circuit 70 boots up. Data Self_Timing (first code) that indicates a period of self refresh and data DLL_Timing (second code) that indicates a period for regular updates of the DLL circuit 70, as well as the DLL enable command DLLEnable, the self-refresh command SelfEnable, and the oscillator enable signal DLL_OSC_Enable described above, are supplied from a ROM 77 to the DLL refresh control circuit 71. These pieces of data are written in the ROM 77 at the time of manufacturing a semiconductor device. A register that is volatile unlike a ROM can be provided and information can be set every time when a power supply is switched on (when a mode register is set).

Regarding the DLL circuit 70, first, the DLL refresh control circuit 71 activates the DLL ON signal DLL_ON that indicates the activating period of DLL while the DLL enable command DLLEnable is activated and the self-refresh command SelfEnable is deactivated, and deactivates the DLL ON signal DLL_ON for the rest. The DLL ON signal DLL_ON is supplied to the DLL circuit 70, the clock-output control circuit 74, and the replica circuit 72. When the DLL ON signal DLL_ON is activated, the DLL circuit 70 generates the internal clock signal LCLK.

Furthermore, when the input oscillator enable signal DLL_OSC_Enable is activated, the DLL refresh control circuit 71 activates the DLL start signal DLL_Start that indicates an update period of the DLL circuit 70 periodically at a period determined based on the data DLL_Timing. The DLL start signal DLL_Start is also supplied to the DLL circuit 70, the clock-output control circuit 74, and the replica circuit 72. The DLL circuit 70 is activated in response to the activation of the DLL start signal DLL_Start and generates the internal clock signal LCLK. With this process, the DLL circuit 70 is periodically updated and a large shift between the phase of the internal clock signal LCLK and the phase of the external clock signal CKS can be prevented.

Regarding the self refresh, when the self-refresh command SelfEnable is activated and the DLL ON signal DLL_ON is deactivated, the DLL refresh control circuit 71 activates a self-refresh start signal SREF_Start regularly at a period indicated by the data Self_Timing and outputs the activated signal to a refresh circuit (REF) 53 (first circuit). The refresh circuit 53 is a circuit that controls the refresh operation of the memory cell array 60 and has a function of outputting row addresses in a predetermined order. The refresh circuit 53 is activated in response to the activation of the self-refresh start signal SREF_Start and outputs a row address next to the last output row address to the row control circuit 51. By repeating this process, the self refresh is eventually performed for the whole row address.

The power-supply terminals 16a and 16b are terminals to which external power-supply voltages VDD and VSS are supplied, respectively. Internal-voltage generation circuits 80 to 82 generate internal voltages VPERD, VPERI2, and VPERI, respectively, based on the internal power-supply voltages VDD and VSS, and supply them to circuits in the semiconductor device 10. Specifically, the internal voltage VPERD is supplied as an operation power supply for the DLL circuit 70. Furthermore, the internal voltage VPERI2 is supplied as an operation power supply for the clock-output control circuits 73 and 74 and the clock transmission circuit 3 (the buffer circuit 75 and the clock tree 76). The internal voltage VPERI is supplied as an operation power supply for other peripheral circuits that are not shown in the drawings.

The overall configuration of the semiconductor device 10 according to the first embodiment is as described above. The DLL refresh control circuit 71 is described next in detail.

Figure 2:
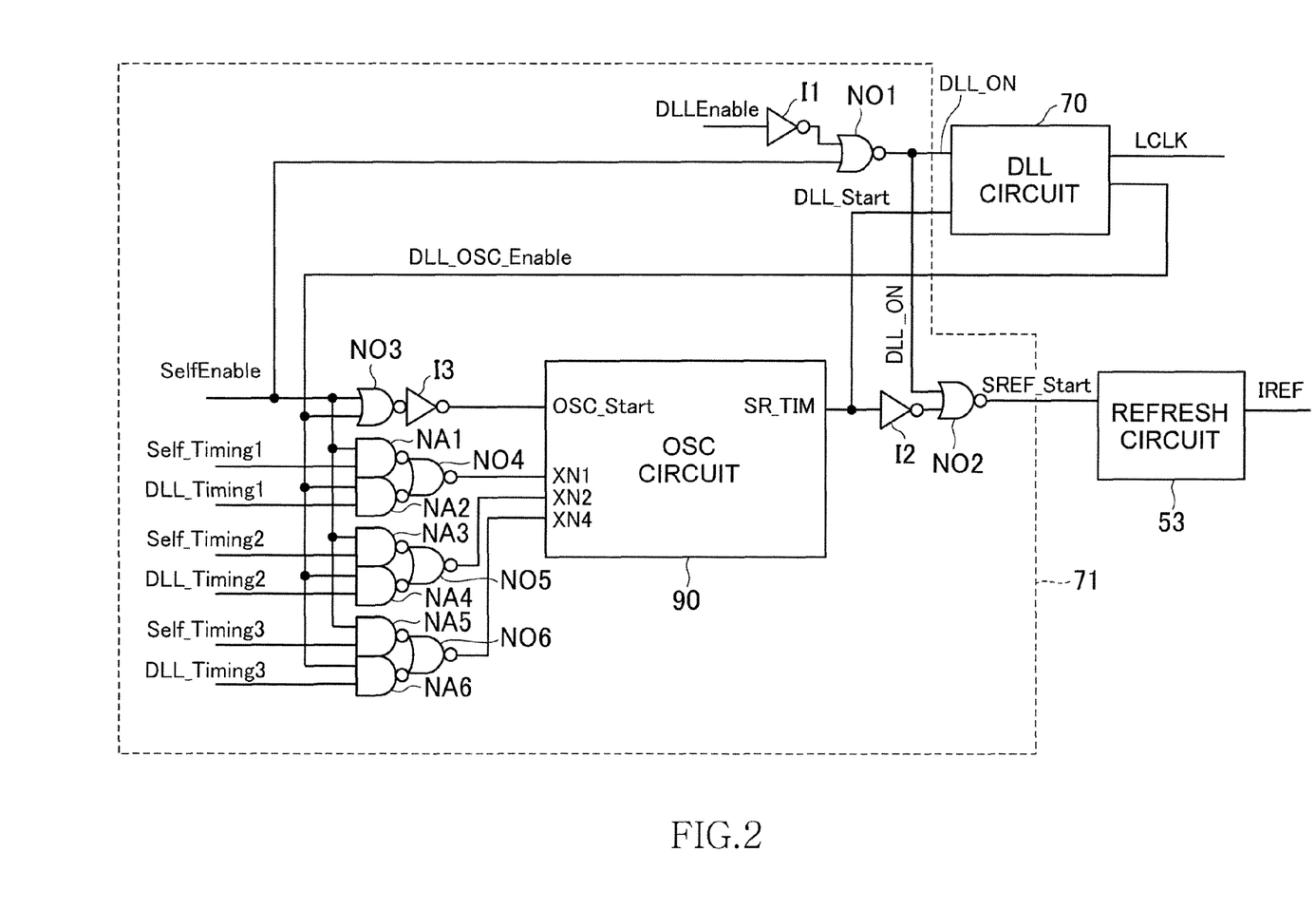
FIG. 2 is a circuit diagram indicative of an embodiment of an internal configuration of the DLL refresh control circuit 71 shown in FIG. 1.

Turning to FIG. 2, the DLL refresh control circuit 71 includes an oscillator (OSC) circuit 90, inverters I1 to I3, NOR circuits NO1 to NO6, and NAND circuits NA1 to NA6.

The DLL enable command DLLEnable is supplied to an input terminal of the inverter I1. Its output terminal is connected to an input terminal of the NOR circuit NO1. The self-refresh command SelfEnable is also input to the input terminal of the NOR circuit NO1. An output signal of the NOR circuit NO1 is supplied to the DLL circuit 70 as the DLL ON signal DLL_ON.

An input terminal of the inverter I2 is connected to an output terminal SR_TIM of the oscillator circuit 90 and its output terminal is connected to an input terminal of the NOR circuit NO2. The DLL ON signal DLL_ON is also input to the input terminal of the NOR circuit NO2. An output signal of the NOR circuit NO2 is supplied to the refresh circuit 53 as the self-refresh start signal SREF_Start. An output signal of the oscillator circuit 90 is used as the DLL start signal DLL_Start.

The self-refresh command SelfEnable and the oscillator enable signal DLL_OSC_Enable are supplied to the NOR circuit NO3. An output terminal of the NOR circuit NO3 is connected through the inverter I3 to an input terminal OSC_Start of the oscillator circuit 90.

The data Self_Timing is supplied from the ROM 77 to input terminals of the NAND circuits NA1, NA3, and NA5. In the first embodiment, the data Self_Timing is 3-bit information, and data Self_Timing1, data Self_Timing2, and data Self_Timing3 shown in FIG. 2 correspond to the respective ones of 3 bits. The self-refresh command SelfEnable is also supplied to the input terminals of the NAND circuits NA1, NA3, and NA5.

The data DLL_Timing is supplied from the ROM 77 to input terminals of the NAND circuits NA2, NA4, and NA6. In the first embodiment, the data DLL_Timing is also 3-bit information, and data DLL_Timing1, data DLL_Timing2, and data DLL_Timing3 shown in FIG. 2 correspond to the respective ones of 3 bits. The oscillator enable signal DLL_OSC_Enable is also supplied to the input terminals of the NAND circuits NA2, NA4, and NA6.

Output signals of the NAND circuits NA1 and NA2 are supplied to an input terminal of the NOR circuit NO4. Similarly, output signals of the NAND circuits NA3 and NA4 are supplied to an input terminal of the NOR circuit NO5, and output signals of the NAND circuits NA5 and NA6 are supplied to an input terminal of the NOR circuit NO6. Output terminals of the NOR circuits NO4 to NO6 are connected to input terminals XN1, XN2, and XN4 of the oscillator circuit 90, respectively.

When the self-refresh command SelfEnable is activated, the data Self_Timing1, Self_Timing2, and Self_Timing3 are supplied to the input terminals XN1, XN2, and XN4 of the oscillator circuit 90, respectively. Meanwhile, when the oscillator enable signal DLL_OSC_Enable is activated, the data DLL_Timing1, DLL_Timing2, and DLL_Timing3 are supplied to the input terminals XN1, XN2, and XN4 of the oscillator circuit 90, respectively.

Figure 3:
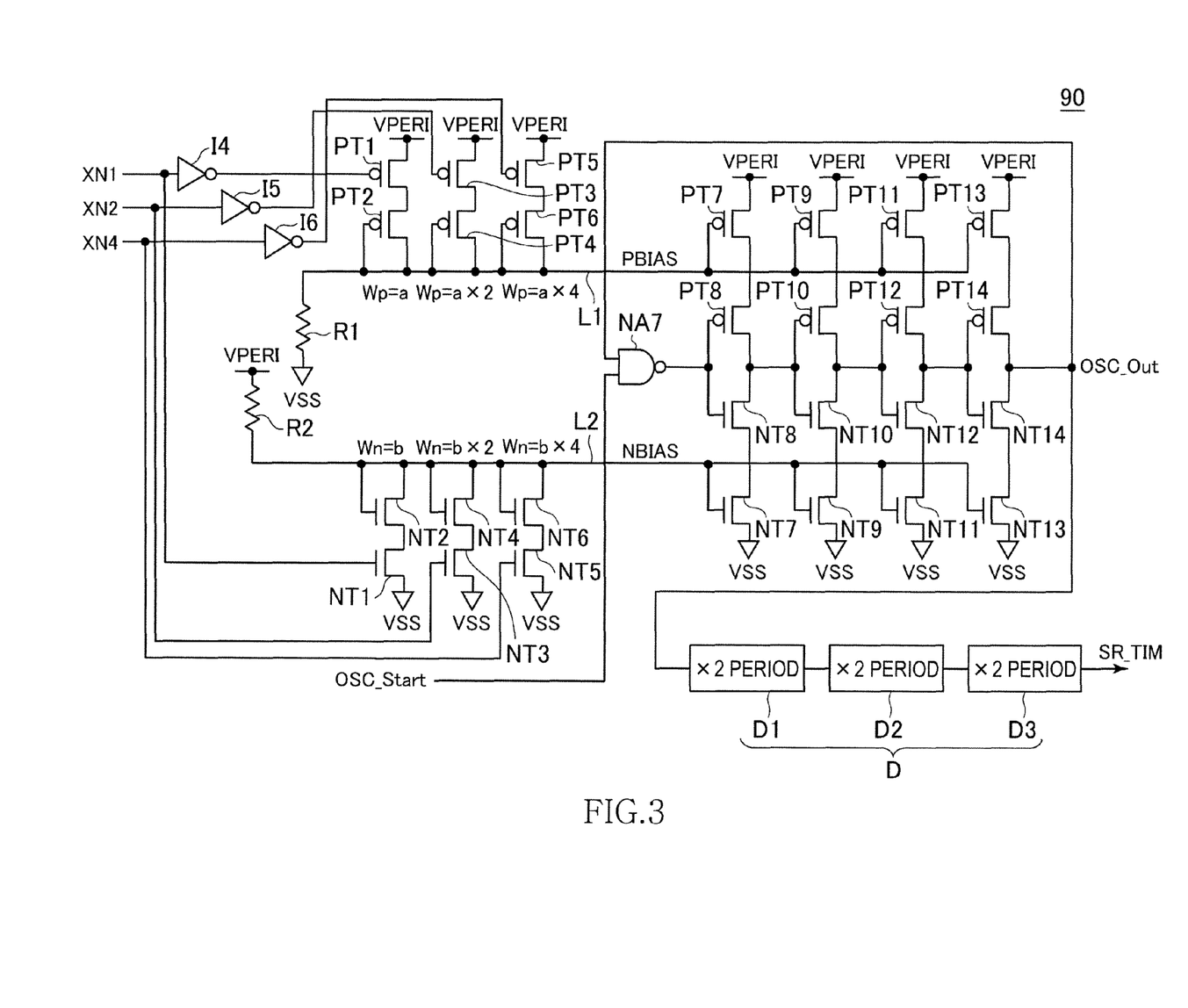
FIG. 3 is a circuit diagram indicative of an embodiment of an internal configuration of the oscillator circuit 90 shown in FIG. 2.

Turning to FIG. 3, the oscillator circuit 90 includes inverters I4 to I6, P-channel transistors PT1 to PT14, N-channel transistors NT1 to NT14, resistors R1 and R2, a NAND circuit NA7, a division circuit D that is constituted by division circuits D1 to D3, and lines L1 and L2.

Input terminals of the inverters I4 to I6 are connected to the input terminals XN1, XN2, and XN4 of the oscillator circuit 90, respectively.

The transistors PT1 and PT2 are transistors having a channel width Wp=a, and are serially connected to each other between a power-supply line (hereinafter, "VPERI line") to which the internal voltage VPERI is supplied and the line L1. A control terminal of the transistor PT1 is connected to an output terminal of the inverter I4 and a control terminal of the transistor PT2 is connected to the line L1. That is, the transistor PT2 is diode-connected.

The transistors PT3 and PT4 are transistors having a channel width Wp=a×2, and are serially connected to each other between the VPERI line and the line L1. A control terminal of the transistor PT3 is connected to an output terminal of the inverter I5 and a control terminal of the transistor PT4 is connected to the line L1. That is, the transistor PT4 is diode-connected.

The transistors PT5 and PT6 are transistors having a channel width Wp=a×4, and are serially connected to each other between the VPERI line and the line L1. A control terminal of the transistor PT5 is connected to an output terminal of the inverter I6 and a control terminal of the transistor PT6 is connected to the line L1. That is, the transistor PT6 is diode-connected.

An end of the line L1 is connected through the resistor R1 to a ground line. Accordingly, when the transistors PT1, PT3, and PT5 are all switched off, a voltage PBIAS of the line L1 (a bias voltage of the oscillator circuit 90) is a ground potential; however, when any of these transistors is switched on, the voltage PBIAS of the line L1 is maintained at the internal voltage VPERI. The capability of maintaining this internal voltage, that is, the capability of supplying current to the line L1 is determined by the sum of current supply capabilities of switched on transistors of the transistors PT1, PT3, and PT5. Switch-on or switch-off of the transistors PT1, PT3, and PT5 is controlled by signals supplied to the input terminals XN1, XN2, and XN4. The capability of supplying current to the line L1 is thus specified by the signals supplied to the input terminals XN1, XN2, and XN4. Specifically, assume that the current supply capability when only the transistor PT1 is conductive is 1. On this assumption, when only the transistor PT3 is conductive, a current supply capability of 2 can be obtained. When only the transistors PT1 and PT3 are conductive, a current supply capability of 1+2=3 can be obtained. When only the transistor PT5 is conductive, a current supply capability of 4 can be obtained. When only the transistors PT1 and PT5 are conductive, a current supply capability of 1+4=5 can be obtained. When only the transistors PT3 and PT5 are conductive, a current supply capability of 2+4=6 can be obtained. When all of the transistors PT1, PT3, and PT5 are conductive, a current supply capability of 1+2+4=7 can be obtained.

The transistors NT1 and NT2 are transistors having a channel width Wn=b, and are serially connected to each other between a power-supply line to which the external power-supply voltage VSS is supplied (hereinafter, "ground line") and the line L2. A control terminal of the transistor NT1 is connected to the input terminal XN1 and a control terminal of the transistor NT2 is connected to the line L2. That is, the transistor NT2 is diode-connected.

The transistors NT3 and NT4 are transistors having a channel width Wn=b×2, and are serially connected to each other between the ground line and the line L2. A control terminal of the transistor NT3 is connected to the input terminal XN2 and a control terminal of the transistor NT4 is connected to the line L2. That is, the transistor NT4 is diode-connected.

The transistors NT5 and NT6 are transistors having a channel width Wn=b×4, and are serially connected to each other between the ground line and the line L2. A control terminal of the transistor NT5 is connected to the input terminal XN4 and a control terminal of the transistor NT6 is connected to the line L2. That is, the transistor NT6 is diode-connected.

An end of the line L2 is connected through the resistor R2 to the VPERI line. Accordingly, when the transistors NT1, NT3, and NT5 are all switched off, a voltage NBIAS of the line L2 (a bias voltage of the oscillator circuit 90) becomes equal to the internal voltage VPERI; however, when any of the transistors is switched on, the voltage NBIAS of the line L2 is maintained at a ground potential. The capability of maintaining this ground potential, that is, the capability of supplying current to the line L2 is determined by the sum of current supply capabilities of switched on transistors of the transistors NT1, NT3, and NT5. Switch-on or switch-off of the transistors NT1, NT3, and NT5 is controlled by the signals supplied to the input terminals XN1, XN2, and XN4. Therefore, the capability of supplying current to the line L2 is specified by the signals supplied to the input terminals XN1, XN2, and XN4. Specifically, assume that the current supply capability when only the transistor NT1 is conductive is 1. On this assumption, when only the transistor NT3 is conductive, a current supply capability of 2 can be obtained. When only the transistors NT1 and NT3 are conductive, a current supply capability of 1+2=3 can be obtained. When only the transistor NT5 is conductive, a current supply capability of 4 can be obtained. When only the transistors NT1 and NT5 are conductive, a current supply capability of 1+4=5 can be obtained. When only the transistors NT3 and NT5 are conductive, a current supply capability of 2+4=6 can be obtained. When all of the transistors NT1, NT3, and NT5 are conductive, a current supply capability of 1+2+4=7 can be obtained.

As described above, the signals supplied to the input terminals XN1, XN2, and XN4 are supplied through the inverters I4 to I6 to the transistors PT1, PT3, and PT5, respectively. The signals supplied to the input terminals XN1, XN2, and XN4 are directly supplied to the transistors NT1, NT3, and NT5, respectively. Accordingly, the transistor PT1 and the transistor NT1, the transistor PT3 and the transistor NT3, and the transistor PT5 and the transistor NT5 are switched on or off in conjunction with each other. The capability of supplying current to the line L1 is thus the same level as the capability of supplying current to the line L2.

The transistors PT7, PT8, NT8, and NT7 are serially connected to each other in this order between the VPERI line and the ground line. Similarly, the transistors PT9, PT10, NT10, and NT9 are serially connected to each other in this order between the VPERI line and the ground line. The transistors PT11, PT12, NT12, and NT11 are serially connected to each other in this order between the VPERI line and the ground line. The transistors PT13, PT14, NT14, and NT13 are serially connected to each other in this order between the VPERI line and the ground line.

The other end of the line L1 is commonly connected to each of control terminals of the transistors PT7, PT9, PT11, and PT13. Meanwhile, the other end of the line L2 is commonly connected to each of control terminals of the transistors NT7, NT9, NT11, and NT13.

A drain of the transistor PT8 (a drain of the transistor NT8) is connected to each of control terminals of the transistors PT10 and NT10. Similarly, a drain of the transistor PT10 (a drain of the transistor NT10) is connected to each of control terminals of the transistors PT12 and NT12, and a drain of the transistor PT12 (a drain of the transistor NT12) is connected to each of control terminals of the transistors PT14 and NT14. An output signal OSC_Out output from a drain of the transistor PT14 (a drain of the transistor NT14) is supplied to an input terminal of the NAND circuit NA7 and an input terminal of the division circuit D.

The input terminal of the NAND circuit NA7 is connected to the input terminal OSC_Start. Furthermore, an output terminal of the NAND circuit NA7 is connected to each of control terminals of the transistors PT8 and NT8.

With the above configuration, when a signal supplied to the input terminal OSC_Start is activated, the output signal OSC_Out becomes a clock signal that oscillates at a predetermined period. As described above, the capability of supplying current to the lines L1 and L2 is specified by combinations of signals supplied to the input terminals XN1, XN2, and XN4. The time required for charging the transistors PT8, PT10, PT12, PT14, NT8, NT10, NT12, and NT14 is specified by the current supplying capability of the transistors PT7, PT9, PT11, PT13, NT7, NT9, NT11, and NT13 whose control terminals are connected to the lines L1 and L2. The specific period of the output signal OSC_Out is thus specified by combinations of signals supplied to the input terminals XN1, XN2, and XN4.

The input terminals XN1, XN2, and XN4 receive the DLL_Timing signal during a DLL operation and the Self_Timing signal during a self-refresh operation. Therefore, potentials of PBIAS/NBIAS according to the respective operations can be generated and the oscillation period of the output signal OSC_Out from the oscillator circuit can correspond to the respective operations.

The division circuit D is constituted by serially connecting the division circuits D1 to D3 that divide input signals into two. The output signal OSC_Out is supplied to an input terminal of the first division circuit D1. An output terminal of the last division circuit D3 is connected to the output terminal SR_TIM. Therefore, a clock signal obtained by dividing the output signal OSC_Out into eight is output from the output terminal SR_TIM.

Figure 4:
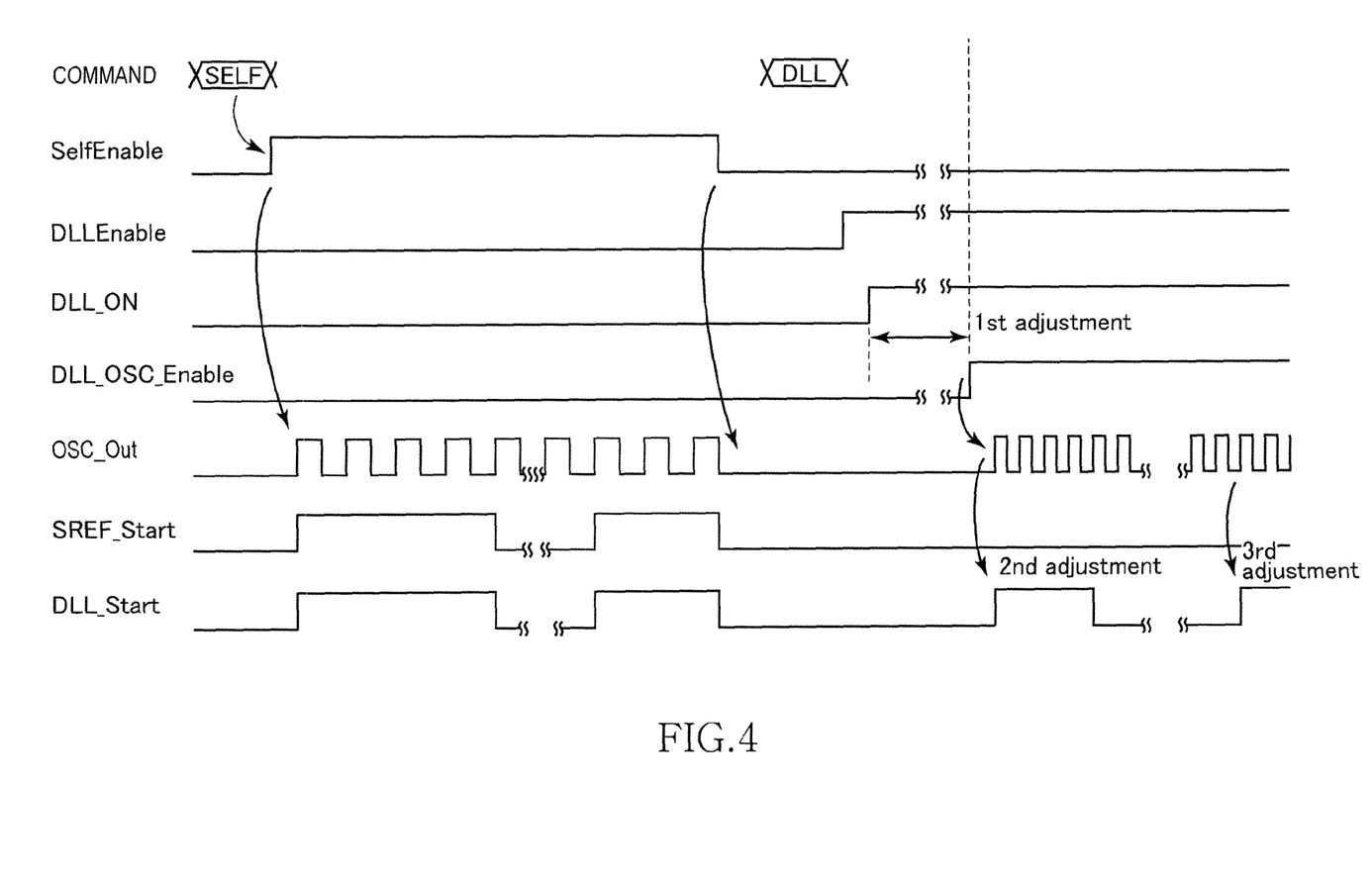
FIG. 4 is a timing diagram indicative of an embodiment of respective signals related to the DLL refresh control circuit 71 shown in FIG. 2.

An operation of the DLL refresh control circuit 71 is described below in detail with reference to FIGS. 1 to 4. FIG. 4 shows an example where a period specified by the data Self_Timing (first period) is set longer than a period specified by the data DLL_Timing (second period).

As shown in FIG. 4, when the self-refresh start command SELF is externally supplied to the command terminal 12 (FIG. 1), the command decoder 32 activates the self-refresh command SelfEnable in response to this. At this time, the DLL enable command DLLEnable and the oscillator enable signal DLL_OSC_Enable are in an inactive state. The activation of the self-refresh command SelfEnable enables the NOR circuit NO1 (FIG. 2) to deactivate the DLL ON signal DLL_ON. The DLL circuit 70 is thus deactivated. Meanwhile, the self-refresh start signal SREF_Start whose period is a period of an output signal of the oscillator circuit 90 (a signal output from the output terminal SR_TIM) starts to be supplied to the refresh circuit 53.

In this case, as described above, the data Self_Timing1, Self_Timing2, and Self_Timing3 are supplied to the input terminals XN1, XN2, and XN4 of the oscillator circuit 90, respectively. Accordingly, as shown in FIG. 4, the period of the output signal OSC_Out becomes relatively long. The self-refresh start signal SREF_Start obtained by dividing the output signal OSC_Out into eight is a clock signal having a relatively long first period (first clock signal). The refresh circuit 53 performs the refresh operation upon the memory cell array 60 according to the self-refresh start signal SREF_Start supplied in the above manner.

While the DLL start signal DLL_Start according to the first embodiment is the output signal of the oscillator circuit 90, it is ignored because the DLL circuit 70 is deactivated and processes based on the DLL start signal DLL_Start are not particularly performed.

Next, when the DLL periodic-update start-command signal DLL is externally supplied to the command terminal 12 (FIG. 1), the command decoder 32 activates the DLL enable command DLLEnable in response to this. At this time, the self-refresh command SelfEnable and the oscillator enable signal DLL_OSC_Enable are in an inactive state. The activation of the DLL enable command DLLEnable activates the DLL ON signal DLL_ON and thus the DLL circuit 70 is also activated.

DLL circuit 70 activates the oscillator enable signal DLL_OSC_Enable as described above after being activated and then locked. The data DLL_Timing1, DLL_Timing2, and DLL_Timing3 are thus respectively supplied to the input terminals XN1, XN2, and XN4 of the oscillator circuit 90 as described above. Accordingly, as shown in FIG. 4, the period of the output signal OSC_Out becomes relatively short and the DLL start signal DLL_Start obtained by dividing the output signal OSC_Out into eight is a clock signal having a relatively short second period (second clock signal). The DLL circuit 70 updates itself according to the DLL start signal DLL_Start supplied in the above manner.

As described above, according to the semiconductor device 10 of the first embodiment, when the self-refresh command SelfEnable is activated, the DLL refresh control circuit 71 generates the self-refresh start signal SREF_Start that is a clock signal having the first period and outputs this signal to the refresh circuit 53. Meanwhile, when the DLL enable command DLLEnable is activated, the DLL refresh control circuit 71 generates the DLL start signal DLL_Start that is a clock signal having the second period and outputs this signal to the DLL circuit 70. The first period can be independently set by the data Self_Timing and the second period can be independently set by the data DLL_Timing. Accordingly, although only one oscillator circuit 90 that occupies a large layout size is used, time intervals of periodic operations of the refresh circuit 53 and the DLL circuit 70 can be set independently. In the first embodiment, while it has been explained that the period of the self-refresh operation is relatively long and the period of the DLL operation is relatively short, the period of the self-refresh operation can be relatively short and the period of the DLL operation can be relatively long, or the period of the self-refresh operation can be equal to that of the DLL operation depending on the values to be set.

Figure 5:
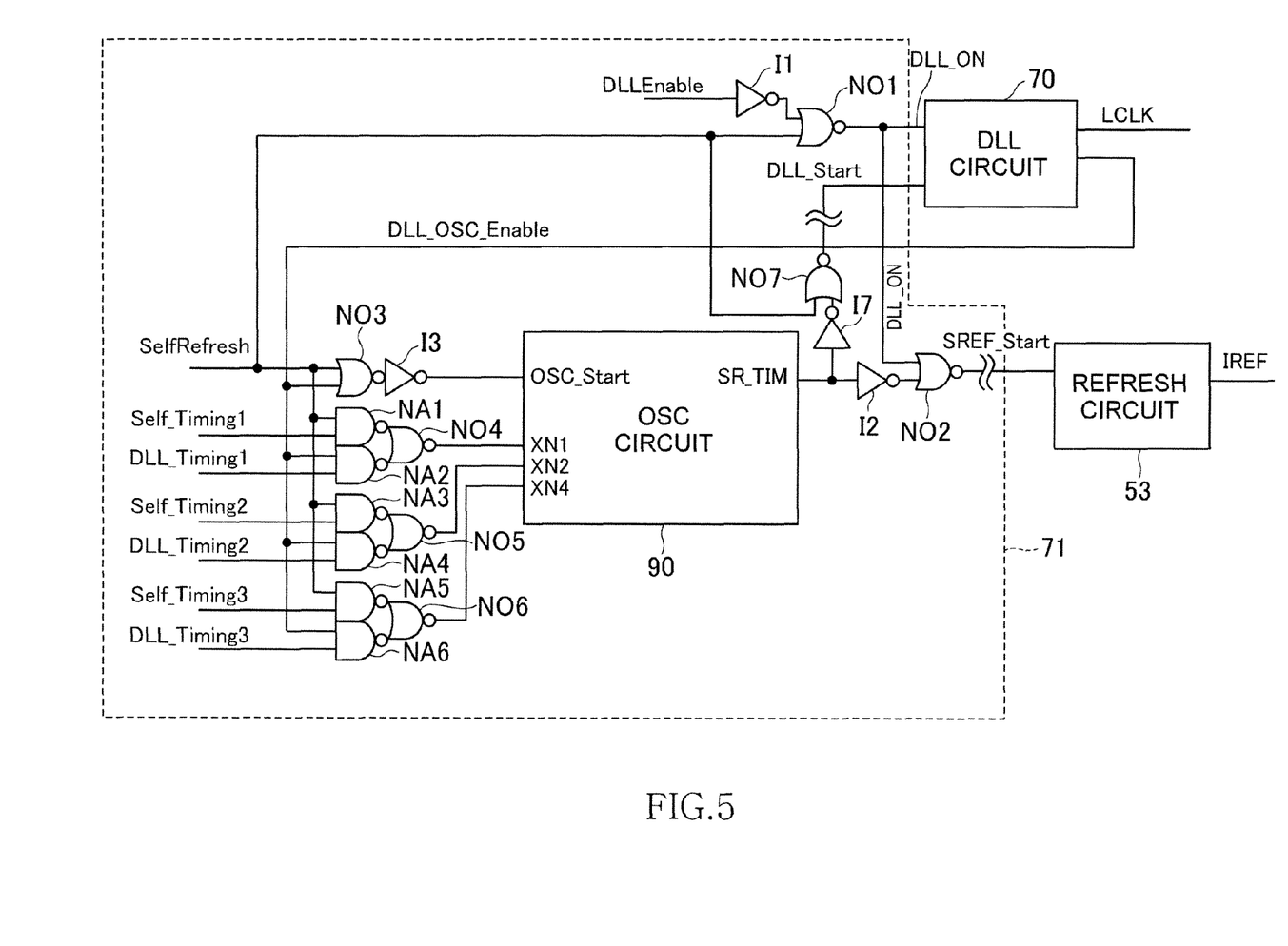
FIG. 5 is a circuit diagram indicative of an embodiment of an internal configuration of the DLL refresh control circuit 71 shown in FIG. 1.

Turing to FIG. 5, the DLL refresh control circuit 71 according to a modification of the first embodiment is different from the DLL refresh control circuit 71 according to the first embodiment in that an inverter I7 and a NOR circuit NO7 are further provided. Other configurations of the semiconductor device 10 according to this modification are identical to those of the semiconductor device 10 according to the first embodiment.

According to this modification, the DLL start signal DLL_Start is an output signal of the NOR circuit NO7. The self-refresh command SelfEnable and an output signal of the inverter I7 are supplied to an input terminal of the NOR circuit NO7. An input terminal of the inverter I7 is connected to the output terminal SR_TIM of the oscillator circuit 90.

With the above configuration, in this modification, while the self-refresh command SelfEnable is activated, the DLL start signal DLL_Start does not become a clock signal having the first period. Therefore, according to this modification, wasteful current consumption can be reduced. Although a signal line for connecting the self-refresh command SelfEnable to the input terminal of the NOR circuit NO7 is required, because the self-refresh command SelfEnable is a stable signal, an increase in current consumption caused by providing this signal line is small.

Figure 6:
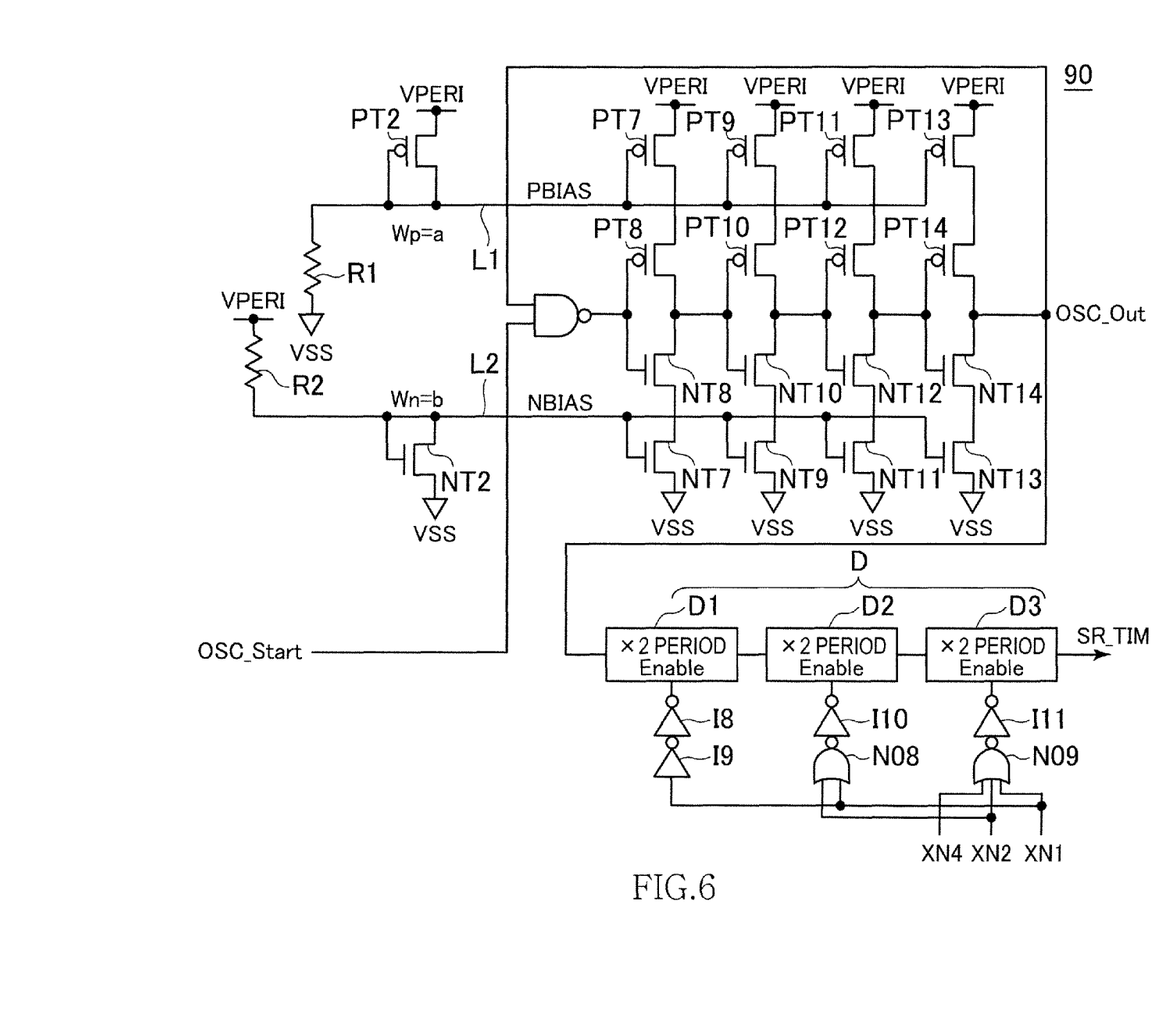
FIG. 6 is a circuit diagram indicative of an embodiment of an internal configuration of the oscillator circuit 90 shown in FIG. 2.

Turning to FIG. 6, the oscillator circuit 90 according to a second embodiment of the present invention is different from the oscillator circuit 90 according to the first embodiment in that the inverters I4 to I6 and the transistors PT1, PT3 to PT6, NT1, and NT3 to NT6 are not included and inverters I8 to I11 and NOR circuits NO8 and NO9 are included instead, the division circuits D1 to D3 have control terminals Enable, and valid/invalid can be switched by signals supplied to the control terminals.

Because the transistors PT1, PT3 to PT6, NT1, and NT3 to NT6 are not included, the capability of supplying current to lines L1 and L2 is always a fixed value in the oscillator circuit 90 according to the second embodiment. Accordingly, the period of the output signal OSC_Out is always fixed. According to the second embodiment, the period of the output signal of the oscillator circuit 90 is switched not by switching the capability of supplying current to the lines L1 and L2 but by controlling the dividing number of the division circuit D according to the data Self_Timing and the data DLL_Timing. Control of the number of divisions of the division circuit D is performed by switching valid/invalid of the division circuits D1 to D3, which is described below in detail.

The control terminal Enable of the division circuit D1 is connected through the inverters I8 and I9 to the input terminal XN1 of the oscillator circuit 90. The control terminal Enable of the division circuit D2 is connected through the inverter I10 to an output terminal of the NOR circuit NO8. An input terminal of the NOR circuit NO8 is connected to the input terminals XN1 and XN2 of the oscillator circuit 90. The control terminal Enable of the division circuit D3 is connected through the inverter I11 to an output terminal of the NOR circuit NO9 and an input terminal of the NOR circuit NO9 is connected to the input terminals XN1, XN2, and XN4 of the oscillator circuit 90.

With the above configuration, when a signal supplied to the input terminal XN1 is activated, the division circuit D1 becomes valid, and becomes invalid otherwise. Furthermore, the division circuit D2 becomes valid when signals supplied to the input terminals XN1 and XN2 are activated and becomes invalid otherwise. Further, the division circuit D3 becomes valid when all signals supplied to the input terminals XN1, XN2, and XN4 are activated and becomes invalid otherwise.

Assume that the period of the output signal OSC_Out is 1. On this assumption, when a signal supplied to the input terminal XN1 is activated, the period of the output signal of the oscillator circuit 90 is $2^3=8$. When the signal supplied to the input terminal XN1 is deactivated and a signal supplied to the input terminal XN2 is activated, the period of the output signal of the oscillator circuit 90 is $2^2=4$. When signals supplied to the input terminals XN1 and XN2 are deactivated and a signal supplied to the input terminal XN4 is activated, the period of the output signal of the oscillator circuit 90 is $2^1=2$. When all signals supplied to the input terminals XN1, XN2, and XN4 are deactivated, the period of the output signal of the oscillator circuit 90 is 1.

In this manner, also in the semiconductor device 10 according to the second embodiment, the period of the output signal of the oscillator circuit 90 can be controlled by combinations of the signals supplied to the input terminals XN1, XN2, and XN4. Accordingly, the first period can be independently set by the data Self_Timing and the second period can be independently set by the data DLL_Timing.

While current consumption of the oscillator circuit 90 varies significantly depending on specific values of the first period and the second period in the semiconductor device 10 according to the first embodiment, according to the semiconductor device 10 of the second embodiment, current consumption of the oscillator circuit 90 does not vary significantly as compared to the first embodiment because the capability of supplying current to the lines L1 and L2 is fixed.

It is apparent that the present invention is not limited to the above embodiments, but may be modified and changed without departing from the scope and spirit of the invention.

For example, while a case of applying the present invention to a refresh operation and a periodic update of a DLL circuit has been explained in the above embodiments, the application scope of the present invention is not limited thereto. The present invention can be applied to any example of providing two circuits that perform periodic operations at different time intervals in a semiconductor device. The time intervals of the periodic operations of these two circuits can be set independently while an increase in layout size is prevented.

Other modifications that are identical to the modification of the first embodiment can be also applied in the second embodiment.

What is claimed is:

1. A semiconductor device comprising:
   a control circuit outputting a first clock signal having a first clock cycle in response to a first command signal and outputting a second clock signal having a second clock cycle in response to a second command signal;
   a first circuit controlled based on the first clock signal;
   a second circuit controlled based on the second clock signal; and
   a storage unit storing a first code indicating the first clock cycle and a second code indicating the second clock cycle, wherein
   the control circuit generates the first clock signal based on the first code when the first command signal is supplied,
   the control circuit generates the second clock signal based on the second code when the second command signal is supplied,
   the control circuit includes an oscillator circuit that generates an oscillating signal,
   each of the first and second codes specifies an oscillating cycle of the oscillating signal,
   the control circuit generates the first clock signal based on the oscillating signal having an oscillating cycle corresponding to the first code when the first command signal is supplied, and
   the control circuit generates the second clock signal based on the oscillating signal having an oscillating cycle corresponding to the second code when the second command signal is supplied.

2. The semiconductor device as claimed in claim 1, wherein the oscillating cycle of the oscillating signal is controlled by a bias voltage that is decided based on the first and second codes.

3. The semiconductor device as claimed in claim 1, wherein
   the control circuit further includes a division circuit, and
   the first and second clock signals are obtained by dividing the oscillating signal by the division circuit.

4. A semiconductor device comprising:
   a control circuit outputting a first clock signal having a first clock cycle in response to a first command signal and outputting a second clock signal having a second clock cycle in response to a second command signal;
   a first circuit controlled based on the first clock signal;
   a second circuit controlled based on the second clock signal; and
   a storage unit storing a first code indicating the first clock cycle and a second code indicating the second clock cycle, wherein
   the control circuit generates the first clock signal based on the first code when the first command signal is supplied,
   the control circuit generates the second clock signal based on the second code when the second command signal is supplied,
   the control circuit includes an oscillator circuit that generates an oscillating signal and a division circuit that divides the oscillating signal to generate the first and second clock signals, and
   a number of divisions of the division circuit is controlled according to the first and second codes.

5. A semiconductor device comprising:
   a plurality of memory cells;
   a control circuit including an oscillator circuit, wherein the oscillator circuit is configured to output a first clock signal in response to a first command signal and a second clock signal in response to a second command signal;
   a first circuit configured to perform a refresh operation on the memory cells in response to the first clock signal; and
   a second circuit configured to generate an internal clock signal indicative of an output timing of read data from an output terminal to an outside in response to the second clock signal.

6. The semiconductor device as claimed in claim 5, wherein the first clock signal is different in a clock cycle period from the second clock signal.

7. The semiconductor device as claimed in claim 6, wherein the first clock signal is longer in clock cycle period than the second clock signal.

8. The semiconductor device as claimed in claim 5, wherein the oscillator circuit is configured to output the first clock signal to an output node thereof when the first command signal takes an active level, to output the second clock signal to the output node thereof when the second command signal takes an active level, and to fix a potential of the output node when both the first and second command signals take an inactive level, the first circuit being configured to perform the refresh operation on the memory cells when the first command signal takes the active level, the second circuit being configured to generate the internal clock signal when the second command signal takes the active level.

9. The semiconductor device as claimed in claim 5, wherein the control circuit further includes a storage unit storing first code corresponding to a clock cycle period of the first clock signal and second code corresponding to a clock cycle period of the second clock signal.

10. The semiconductor device as claimed in claim 5, wherein the second circuit comprises a clock generation circuit configured to receive an external clock signal and to delay the external clock signal to generate the internal clock signal.

11. The semiconductor device, as claimed in claim 5, wherein the control circuit comprises a first input that receives the first control signal and a second input that receives the second control signal.

* * * * *